(12) United States Patent
Joung et al.

(10) Patent No.: US 6,297,084 B1
(45) Date of Patent: Oct. 2, 2001

(54) METHOD FOR FABRICATING SEMICONDUCTOR MEMORY

(75) Inventors: Ku Chul Joung; Wouns Yang, both of Chungcheongbuk-do; Kun Sik Park, Taejon-kwangyoksi, all of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/383,635

(22) Filed: Aug. 26, 1999

(30) Foreign Application Priority Data

Sep. 3, 1998 (KR) ................................. 98-36339
Sep. 3, 1998 (KR) ................................. 98-36342

(51) Int. Cl.[7] ................... H01L 21/8234; H01L 21/8244
(52) U.S. Cl. ................. 438/238; 438/258; 438/275; 438/279; 438/381; 438/382; 438/384
(58) Field of Search .................. 438/238, 258, 438/275, 279, 381, 382, 384

(56) References Cited

U.S. PATENT DOCUMENTS 5,545,581 * 8/1996 Armacost et al. .................. 438/631
6,048,795 * 4/2000 Numasawa et al. ................. 438/685

* cited by examiner

Primary Examiner—Charles Bowers
Assistant Examiner—Asok Kumar Saricar

(57) ABSTRACT

A method for fabricating a semiconductor memory, in which a resistive layer is formed of a material identical to a material of a cell plug layer at a time of formation of the cell plug layer. In addition, a contact pad layer formed of a salicide layer on the cell plug layer is formed with an area larger than the plug layer for simplifying the fabrication process and securing an adequate fabrication allowance, including the steps of (1) forming metal gate electrodes on a semiconductor substrate inclusive of a cell region and a peripheral circuit region, (2) forming gate sidewalls at sides of the gate electrode layers on the cell region and forming a material layer for forming a plug on an entire surface, (3) patterning the material layer for forming a plug on the peripheral circuit region, to form a resistive layer, (4) planarizing the material layer for forming a plug on the cell region, to form a plug layer which stuffs spaces between the gate electrode layers, and (5) selectively forming contact pad layers on a top of the plug layer on the cell region and a portion of the peripheral circuit region and converting into silicide.

19 Claims, 5 Drawing Sheets

METHOD FOR FABRICATING SEMICONDUCTOR MEMORY

BACKGROUND OF THE INVENTION

1. Field of the Invention

The present invention relates to a semiconductor memory, and more particularly, to a method for fabricating a semiconductor memory, in which a resistive layer is formed of a material identical to a material of a cell plug layer at a time of formation of the cell plug layer and an area of a salicide layer on the cell plug layer is formed larger, for simplifying the fabrication process and securing an adequate fabrication allowance.

2. Background of the Related Art

A related art semiconductor memory will be explained with reference to the attached drawings. FIGS. 1A–1E illustrate sections showing the steps of a related art method for fabricating a semiconductor memory.

Referring to FIG. 1A, the related art method for fabricating a semiconductor memory starts with forming a device isolating layer 2 in a device isolating region of a semiconductor substrate 1 by an STI (Shallow Trench Isolation) and forming a gate oxide film on an entire surface. A polysilicon layer for forming a gate electrode and an insulating material layer ate formed on the gate oxide film 3 in succession, and subjected to selective patterning by photolithography, to form a polygate layer 4a and a cap insulating layer 4b. In this instance, a gate electrode layer (a wordline) 6 of a cell transistor is formed in a cell region, and a gate electrode layer 7 of a driver transistor used in input/output of data is formed in a peripheral circuit region. The polygate layer 4a for forming a gate electrode and the cap insulating layer 4b are patterned with a dummy pattern in a portion of the peripheral circuit region, for use as a restrictive layer 5 for forming a circuit. Though not shown in the drawing, there are impurity regions for use as source/drain form in surfaces of the semiconductor substrate 1 on both sides of the gate electrode. Then, as shown in FIG. 1B, a material layer for forming gate sidewalls is formed on an entire surface inclusive of the cell region and the peripheral circuit region, a mask layer is formed of a material, such as photoresist (not shown) on the device isolation region, and etched back to form gate sidewalls 8 at sides of the gate electrode layer 6 in the cell region. As shown in FIG. 1C, the photoresist layer used as the mask layer in the etch back is removed. A material layer for forming a plug, for example, a polysilicon layer is formed on an entire surface, and etched back, to form a polyplug layer 9 which is in contact with the impurity regions and stuffing spaces between the gate electrodes 6 (but insulated from the gate electrode layer by the gate sidewalls). Then, as shown in FIG. 1D, the cell region is masked by a material layer of photoresist and the like, a material layer for forming sidewalls is formed on an entire surface of the peripheral circuit region, and etched back, to form gate sidewalls 10. In this instance, in order not to leave the material layer for forming gate sidewalls, an overetch is made in the etch back, to etch portions of the device isolation layer 2 and the cap insulation layer 4b. As shown in FIG. 1E, a salicide layer 10 is formed on the polyplug layer 9 and the impurity region in the device isolating region, and an ILD (Inter Layer Dielectric) layer 11 is formed on an entire surface. Then, the ILD layer 11 is etched selectively until the salicide layer 10 is exposed, to form a bitline contact hole 12.

In the forgoing related art method for fabricating a semiconductor memory, the polysilicon layer is patterned, to form the wordline as well as the resistive layer 5 in the peripheral circuit region at the same time. Then, the polyplug layer 9 is deposited and the salicide layer is formed, for improving gluing with a bitline formed later and electrical characteristics such as a contact resistance.

However, the aforementioned related art semiconductor memory has the following problems.

The use of polysilicon as a material of the wordline puts limitation in a signal transmission speed, making implementation of a high speed memory difficult. In order to solve the problem of operation speed, the material of the wordline and the bitline is replaced with metal. However, the wordline and the bitline formed of metal requires formation of the resistive layer of polysilicon additionally, resulting in entire fabrication process complicated.

The formation of salicide layer after deposition of the polyplug layer puts limitation on an area of the contact hole, and limitation on a salicide area caused by an alignment error, even within a tolerance in formation of the bitline contact hole it deteriorates a contact performance.

The overetch occurring in contact hole formation is liable to cause short with a gate electrode layer.

SUMMARY OF THE INVENTION

Accordingly, the present invention is directed to a method for fabricating a semiconductor memory that substantially obviates one or more of the problems due to limitations and disadvantages of the related art.

An object of the present invention is to provide a method for fabricating a semiconductor memory, which can simplify a fabrication process and provides an adequate fabrication allowance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a semiconductor memory includes the steps of (1) forming metal gate electrodes on a semiconductor substrate inclusive of a cell region and a peripheral circuit region, (2) forming gate sidewalls at sides of the gate electrode layers on the cell region and forming a material layer for forming a plug on an entire surface, (3) patterning the material layer for forming a plug on the peripheral circuit region, to form a resistive layer, (4) planarizing the material layer for forming a plug on the cell region, to form a plug layer which stuffs spaces between the gate electrode layers, and (5) selectively forming contact pad layers on a top of the plug layer on the cell region and a portion of the peripheral circuit region and converting into silicide.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. FIGS. 2A~2G illustrate sections showing the steps of a method for fabricating a semiconductor memory in accordance with a preferred embodiment of the present invention.

The present invention suggests a metal gate, and a portion of a plug layer for connecting an upper wiring (a bitline) and a lower wiring (a wordline) is left in a peripheral circuit region as a dummy pattern for use as a resistive layer. A sufficient area of a salicide layer is secured on the plug layer for securing an adequate fabrication allowance, of which fabrication steps will be explained.

Figure 1A:
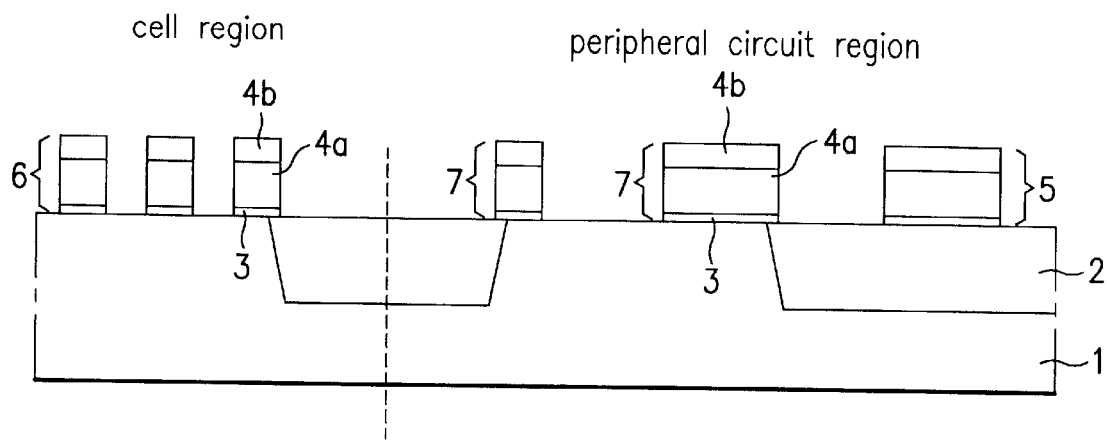
FIGS. 1A~1E illustrate sections showing the steps of a related art method for fabricating a semiconductor memory; and, FIGS. 2A~2G illustrate sections showing the steps of a method for fabricating a semiconductor memory in accordance with a preferred embodiment of the present invention.
Figure 1B:
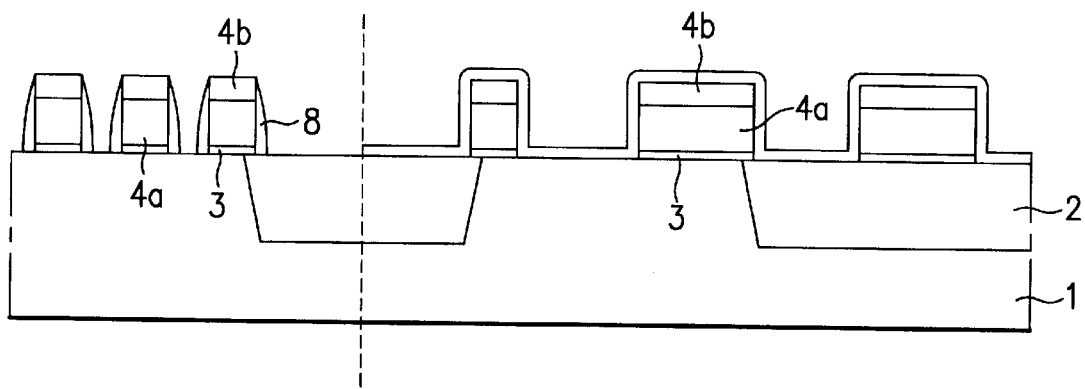
Figure 1C:
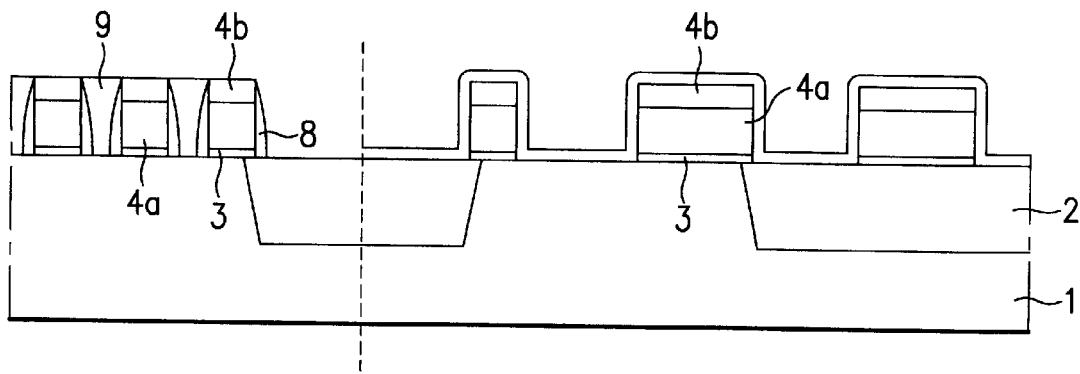
Figure 1D:
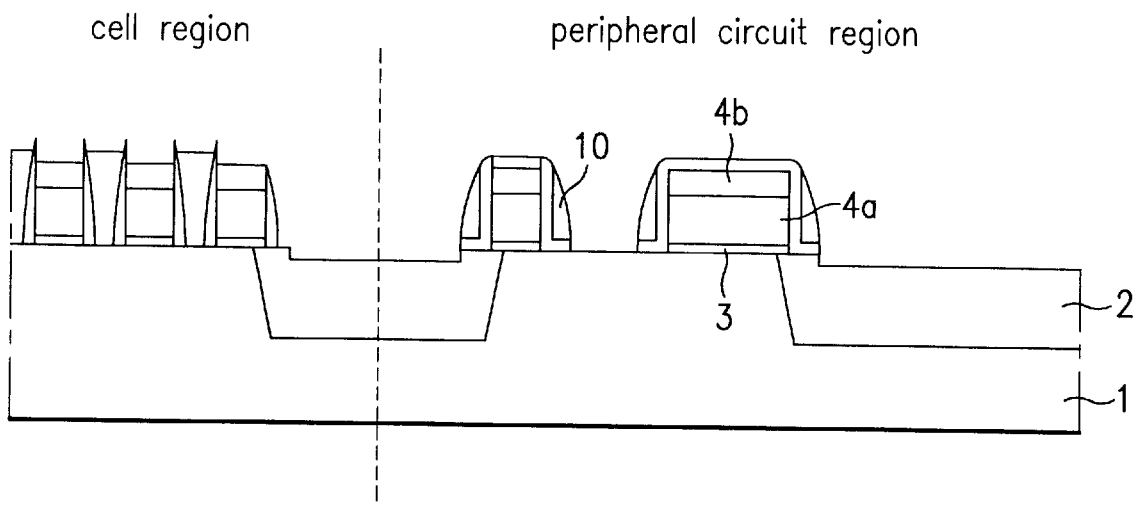
Figure 1E:
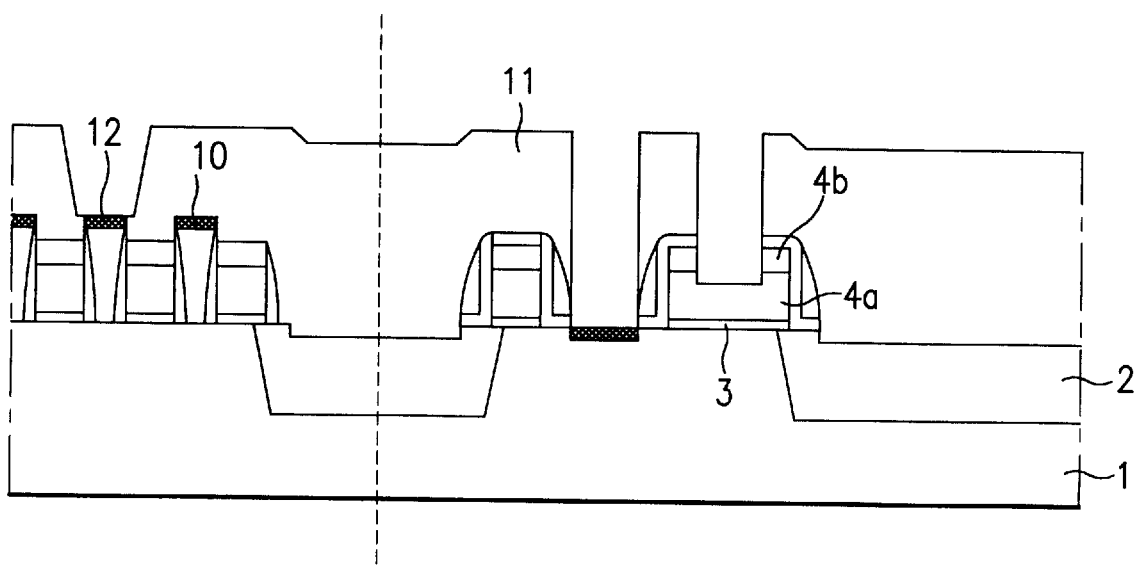
Figure 2A:
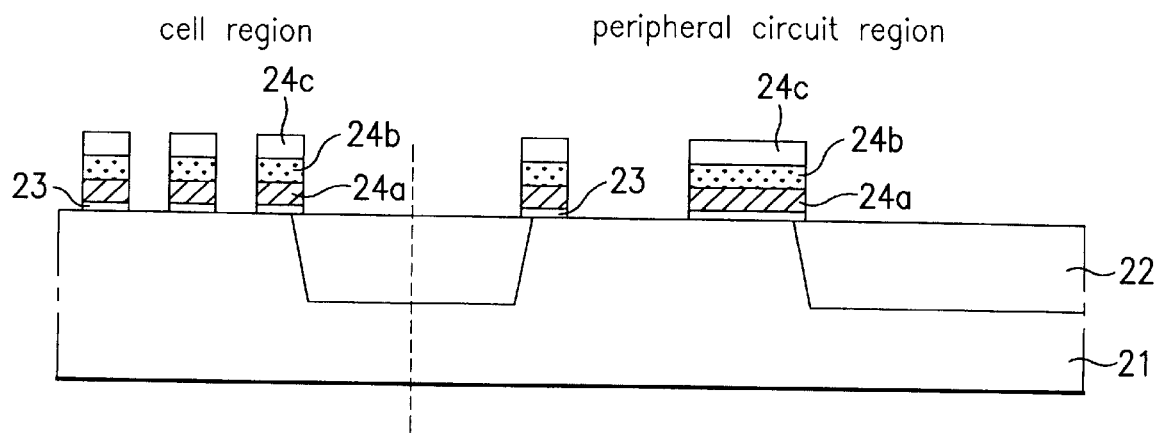
Figure 2B:
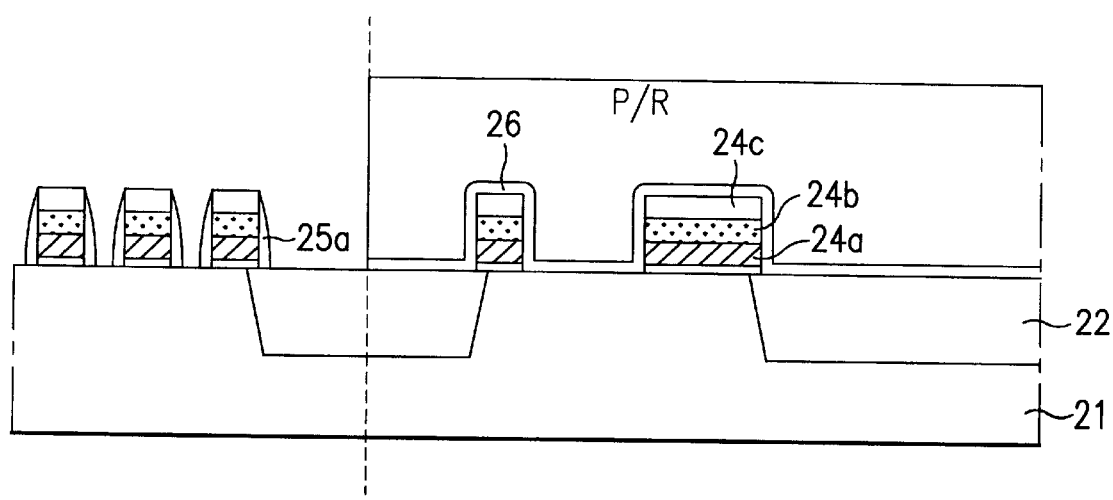
Figure 2C:
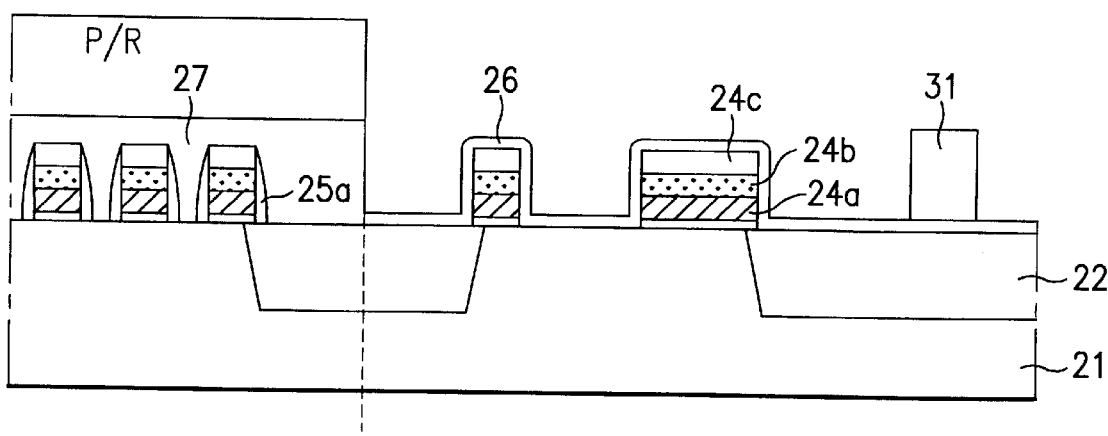
Figure 2D:
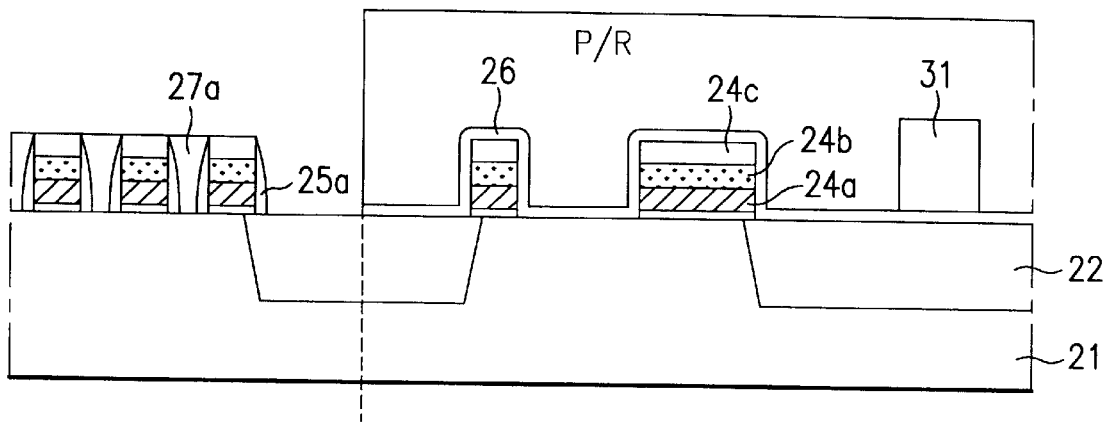
Figure 2E:
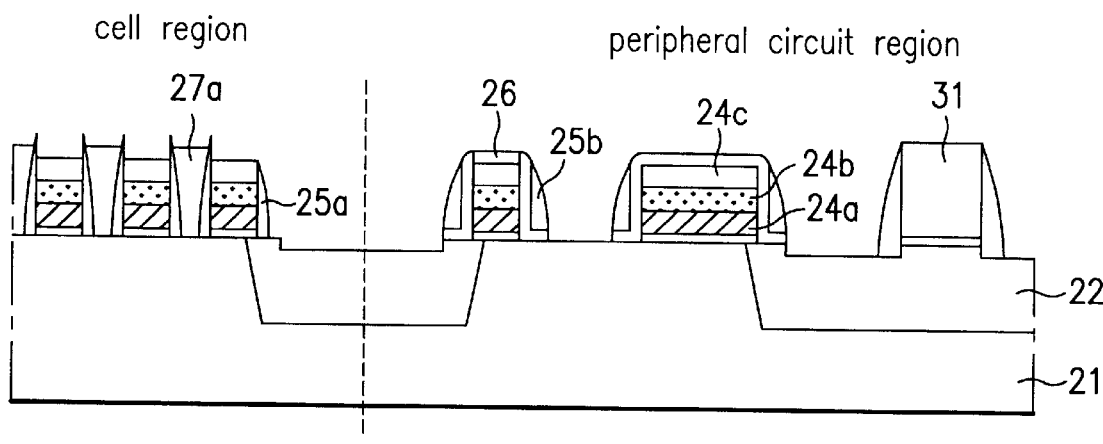
Figure 2F:
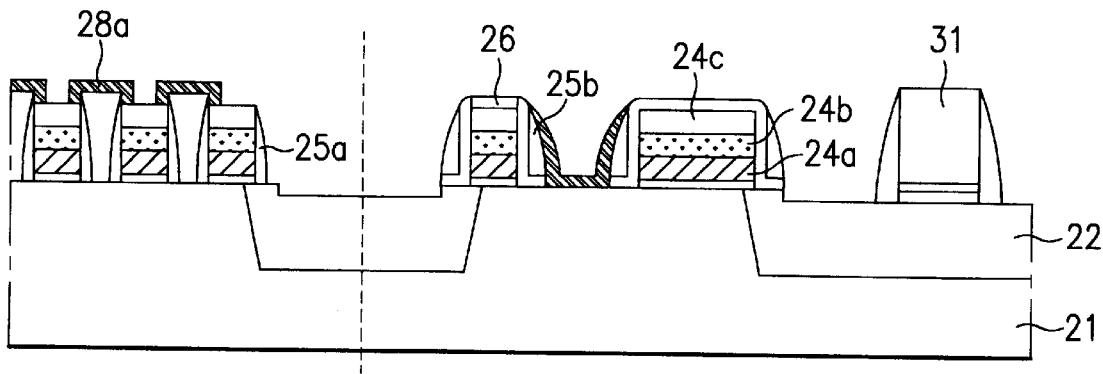
Figure 2G:
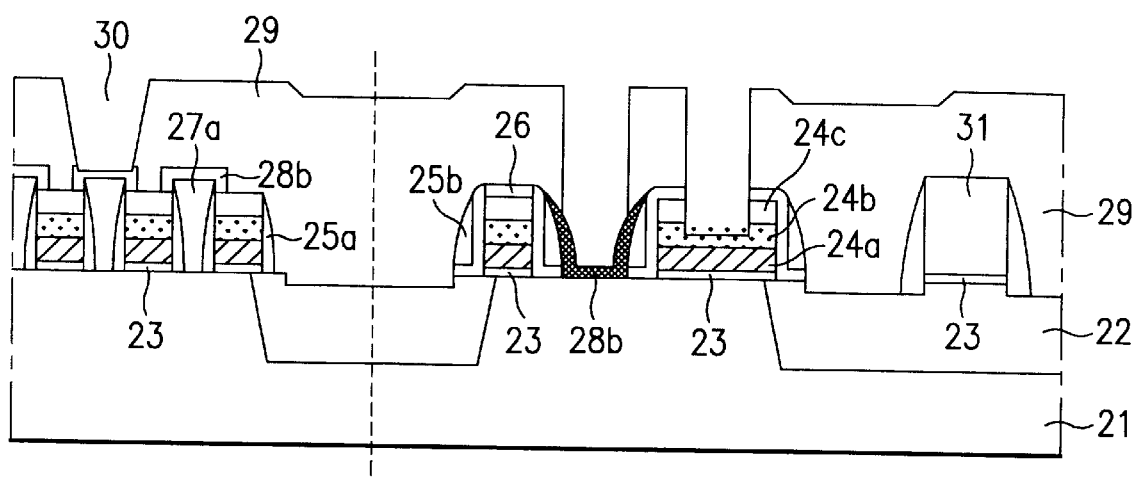

Referring to FIG. 2A, a device isolating layer 22 is formed on a device isolating region of the semiconductor substrate 21 by STI (Shallow Trench Isolation), and a gate oxide film 23 is formed on an entire surface. A polysilicon layer for forming a gate electrode (wordline), a metal material layer, an insulating material layer are formed in succession on the gate oxide film 23, and subjected to patterning by photolithography, to form a wordline having a polygate layer 24a, a metal gate layer 24b, and a cap insulating layer 24c. In this instance, a gate electrode layer (a wordline) of a cell transistor is formed on the cell region, and a gate electrode layer of a driver transistor used in data input/output is formed on the peripheral circuit region. Though not shown, there are impurity regions used as source/drain formed in surfaces of the semiconductor substrate 1 on both sides of the gate electrode. There may be a barrier material layer between the polygate layer 24a and the metal gate layer 24b for improving gluing between the two materials. As shown in FIG. 2B, an insulating layer 26 for forming gate sidewalls is formed on an entire surface inclusive of the cell region and the peripheral circuit region, and a mask layer is formed of photoresist on the peripheral circuit region, and etched back to form gate sidewalls 25a at sides of the gate electrode layer 24a, 24b and 24c. As shown in FIG. 2C, the photoresist layer used as the mask layer in the etch back is removed, and a material layer for forming a plug, such as a polysilicon layer 27 is deposited on an entire surface, and subjected to patterning by selectively etching, to leave on the cell region and a portion of the peripheral circuit region. The polysilicon layer 27 left on the peripheral circuit region is a dummy pattern layer to be used as a resistive layer 31. Thus, the polysilicon layer 27 for forming a plug is patterned to leave the polysilicon layer 27 only on a portion of the cell region because the bitline is formed only on the cell region. Then, as shown in FIG. 2D, the polysilicon layer is planarized by etch back, to form a polyplug layer 27a in contact with the impurity regions and stuffing spaces between the gate electrode layers (insulated from the gate electrode layer by the gate sidewalls). In this instance, the peripheral circuit region is masked by photoresist or the like. And, as shown in FIG. 2E, a material layer for forming sidewalls is formed on an entire surface, and etched back, to form gate sidewalls 25b at sides of the gate electrode layer on the peripheral circuit region. In this instance, an overetch is made such that the insulating layer for forming sidewalls on the impurity regions in the peripheral circuit region is removed completely, etching a portion of the device isolating layer 22, the cap insulating layer 24c, and the like As shown in FIG. 2F, a polysilicon layer for forming a contact pad is formed on an entire surface, inclusive of the polyplug layer 27a and the impurity regions in the peripheral circuit region, and etched selectively, to form a contact pad 28a. In this instance, the polysilicon layer for forming contact pad is left on the impurity region on one side of the gate electrode layer on the peripheral circuit region, too. Then, as shown in FIG. 2g, a salicide forming process is conducted using the contact pad layer 28a and the polysilicon layer for forming contact pad left on the impurity region on one side of the gate electrode layer on the peripheral circuit region, to form a salicide layer 28b, as shown in FIG. 2G. The salicide layer 28b is formed according to the steps, including deposition of a refractory metal layer by a general method, subjecting to annealing, and removing a portion of the metal layer that made no reaction with the insulating layer. In this instance, care should be taken that no salicide layer is formed on the resistive layer 31. An ILD layer 29 is formed on an entire surface, and selectively etched, to form a bitline contact hole 30. The aforementioned method for fabricating a memory can provide a larger area of the salicide on the cell plug, to reduce a bitline contact resistance.

The method for fabricating a semiconductor memory of the present invention as has been explained has the following advantages.

The formation of a salicide layer after securing an adequate contact area by forming a contact pad layer after deposition of the polyplug layer permits to secure an adequate contact hole formation area, which increases a fabrication allowance in formation of the bitline contact hole, that is favorable in view of a fabrication efficiency. And, short circuit with the gate electrode coming from overetch in formation of the contact hole can be prevented.

The use of the dummy pattern layer of polysilicon as a resistive layer in formation of the polyplug layer makes the fabrication process easy because the gate electrode (wordline) may be formed of a metal and an additional resistive layer may not be formed.

It will be apparent to those skilled in the art that various modifications and variations can be made in the method for fabricating a semiconductor memory of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor memory, comprising the steps of:

(1) forming metal gate electrodes on a semiconductor substrate inclusive of a cell region and a peripheral circuit region;

(2) forming gate sidewalls at sides of the gate electrode layers on the cell region and forming a material layer for forming a plug on an entire surface;

(3) patterning the material layer for forming a plug on the peripheral circuit region, to form a resistive layer;

(4) planarizing the material layer for forming a plug on the cell region, to form a plug layer which stuffs spaces between the gate electrode layers; and, (5) selectively forming contact pad layers on a top of the plug layer on the cell region and a portion of the peripheral circuit region and converting into silicide.

2. A method as claimed in claim 1, wherein the metal gate electrode is formed by stacking a polysilicon layer, a metal material layer, and a cap insulating layer in succession and subjecting to selective patterning.

3. A method as claimed in claim 2, wherein the metal gate electrode further includes a barrier material layer between the polysilicon layer and the metal material layer.

4. A method as claimed in claim 1, wherein the step of forming gate sidewalls at sides of the gate electrode layers on the cell region in the step (2) includes the steps of;

forming a material layer for forming sidewalls on an entire surface, inclusive of the cell region and the peripheral circuit region, forming a mask layer of photoresist on the peripheral circuit region, and etching back the material layer for forming sidewalls on the cell region.

5. A method as claimed in claim 1, further comprising the step of forming a mask layer of photoresist on a device isolation region inclusive of a resistive layer before the step (4).

6. A method as claimed in claim 1, further comprising the steps of;

forming a device isolating layer on the device isolating region in the semiconductor substrate by STI, and forming a gate oxide film on an entire surface, before the step (1).

7. A method as claimed in claim 1, further comprising the step of forming impurity regions in surfaces of the semiconductor substrate on both sides of the metal gates for use as source/drain.

8. A method as claimed in claim 1, wherein the step of forming gate sidewalls at sides of the gate electrode layers on the cell region in the step (2) includes;

forming a material layer for forming gate sidewalls on an entire surface, inclusive of the cell region and the peripheral circuit region, forming a photoresist mask layer on the material layer for forming the gate sidewalls on the peripheral circuit region, and etching back the material layer for forming the gate sidewalls on the cell region.

9. A method as claimed in claim 1, further comprising the step of forming a photoresist mask layer on the peripheral circuit region before the step (4).

10. A method as claimed in claim 1, further comprising the step of forming an ILD layer on an entire surface and selectively etching the ILD layer, to form a bitline contact hole after the step (5).

11. A method as claimed in claim 1, wherein the material layer for forming a plug is polysilicon.

12. A method as claimed in claim 1, wherein the contact pad layer is formed on a top surface of the plug layer and on a top surface of sides of the plug layer with an area greater than the plug layer.

13. A method as claimed in claim 12, wherein the contact pad layer is formed of polysilicon.

14. A method as claimed in claim 1, further comprising the step of forming gate sidewalls at sides of the gate electrode layers on the peripheral circuit region before the step of forming contact pads in the step (5).

15. A method as claimed in claim 14, wherein an overetch is made in an etch back in the step of forming gate sidewalls at sides of the gate electrode layers on the peripheral circuit region.

16. A method for fabricating a semiconductor memory, comprising the steps of:

(1) forming a gate oxide film on an entire surface of the semiconductor substrate inclusive of a cell region and a peripheral circuit region;

(2) selectively forming metal gate electrodes on the gate oxide film and forming impurity regions in surfaces of the semiconductor substrate on both sides of the metal gate electrode;

(3) forming an insulating layer for forming gate sidewalls on an entire surface and forming the gate sidewalls at sides of the gate electrode layer;

(4) forming a material layer for forming a plug on an entire surface and patterning the material layer for forming a plug on the peripheral circuit region, to form a resistive layer;

(5) planarizing the material layer for forming a plug on the cell region to form a plug in contact with the impurity region and stuffing spaces between the gate electrode layers;

(6) forming gate sidewalls at sides of the gate electrode on the peripheral circuit region, and forming a polysilicon layer for forming contact pads on an entire surface and subjecting to selectively etching for forming a contact pad layer on a top of the plug layer and on a portion of the peripheral circuit region;

(7) using the contact pad layer in conducting a salicide forming process, to form a salicide layer; and, (8) forming an ILD layer on an entire surface, and selectively etching the ILD layer, for forming a bitline contact hole.

17. A method as claimed in claim 16, wherein the metal gate electrode is selectively formed on the cell region and the peripheral region by forming a polysilicon layer, a metal material layer, and an insulating material layer on the gate oxide film in succession and subjecting to patterning by photolithography.

18. A method as claimed in claim 16, wherein the material for forming a plug is polysilicon.

19. A method as claimed in claim 16, wherein the contact pad layer is formed larger than an area of the plug layer and connected thereto.

* * * * *